United States Patent
Houston

(10) Patent No.: US 6,611,451 B1
(45) Date of Patent: Aug. 26, 2003

(54) MEMORY ARRAY AND WORDLINE DRIVER SUPPLY VOLTAGE DIFFERENTIAL IN STANDBY

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/185,380

(22) Filed: Jun. 28, 2002

(51) Int. Cl.[7] .............................. G11C 11/00; G11C 8/00
(52) U.S. Cl. .................... 365/154; 365/156; 365/230.06
(58) Field of Search ......................... 365/189.09, 200, 365/201, 230.02, 230.03, 230.06, 154, 156

(56) References Cited

U.S. PATENT DOCUMENTS

| | | | | |
|---|---|---|---|---|
| 5,274,601 A | * | 12/1993 | Kawahara et al. ..... | 365/230.06 |
| 5,274,788 A | * | 12/1993 | Koike .................... | 365/230.03 |
| 5,361,227 A | * | 11/1994 | Tanaka et al. .............. | 365/200 |
| 5,634,105 A | * | 5/1997 | Mizuno .................. | 365/230.02 |
| 5,771,190 A | * | 6/1998 | Okamura ............... | 365/230.06 |
| 5,943,273 A | * | 8/1999 | Hidaka et al. .......... | 365/189.09 |
| 6,198,671 B1 | * | 3/2001 | Aoyama et al. ........ | 365/230.06 |

\* cited by examiner

*Primary Examiner*—Trong Phan
(74) *Attorney, Agent, or Firm*—Alan K. Stewart; W. James Brady, III; Frederick J. Telecky, Jr.

(57) ABSTRACT

An SRAM array 22, with improved leakage in standby, raises the wordline driver lower supply voltage Vss-WL when raising the array lower supply voltage Vss-array in standby. When the SRAM array 22 is in active mode, a source voltage is provided to the SRAM array lower supply node Vss-array and to the wordline driver lower supply node Vss-WL. When the SRAM array is in standby mode, a voltage offset is provided between the source voltage and both the SRAM array lower supply node Vss-array and the wordline driver lower supply node Vss-WL.

12 Claims, 2 Drawing Sheets

MEMORY ARRAY AND WORDLINE DRIVER SUPPLY VOLTAGE DIFFERENTIAL IN STANDBY

FIELD OF THE INVENTION

This invention generally relates to electronic systems and in particular it relates to a memory array and wordline driver with supply voltage differential in standby.

BACKGROUND OF THE INVENTION

Maintaining SRAM arrays in a low power standby mode is becoming increasingly important both because of the increasing size (number of bits) of embedded SRAM and because of the increasing leakage of transistors as technology is scaled. Scaling to shorter gage length leads to use of thinner gate dielectrics, which in turn leads to use of lower voltages. Performance is reduced with lower voltage, leading to use of lower threshold voltages, and resulting higher subthreshold current.

One approach to reduce SRAM array leakage in standby is to raise the array lower supply voltage (Vss-array) This reduces the array leakage both by reducing the voltage across transistors in the array and by effectively applying a back-gate bias on the n-channel transistors, raising their threshold voltage. Initially, it might be considered an advantage to keep the off wordlines at the substrate voltage, putting a negative gate-to-source voltage on the pass gates of the SRAM cells, turning them off strongly. However, too negative a gate-to-source voltage will actually increase the leakage. The increase in leakage is due to a combination of gate leakage and Gate-Induced-Drain-Leakage (GIDL), both of which increase with increasing negative gate-to-source voltage on the pass gates in the SRAM array. This effectively limits how much SRAM standby power can be reduced by raising Vss-array.

SUMMARY OF THE INVENTION

An SRAM array, with improved leakage in standby, raises the wordline driver lower supply voltage when raising the array lower supply voltage in standby. When the SRAM array is in active mode, a source voltage is provided to the SRAM array lower supply node and to the wordline driver lower supply node. When the SRAM array is in standby mode, a voltage offset is provided between the source voltage and both the SRAM array lower supply node and the wordline driver lower supply node.

DETAILED DESCRIPTION OF PREFERRED EMBODIMENT

Figure 1:
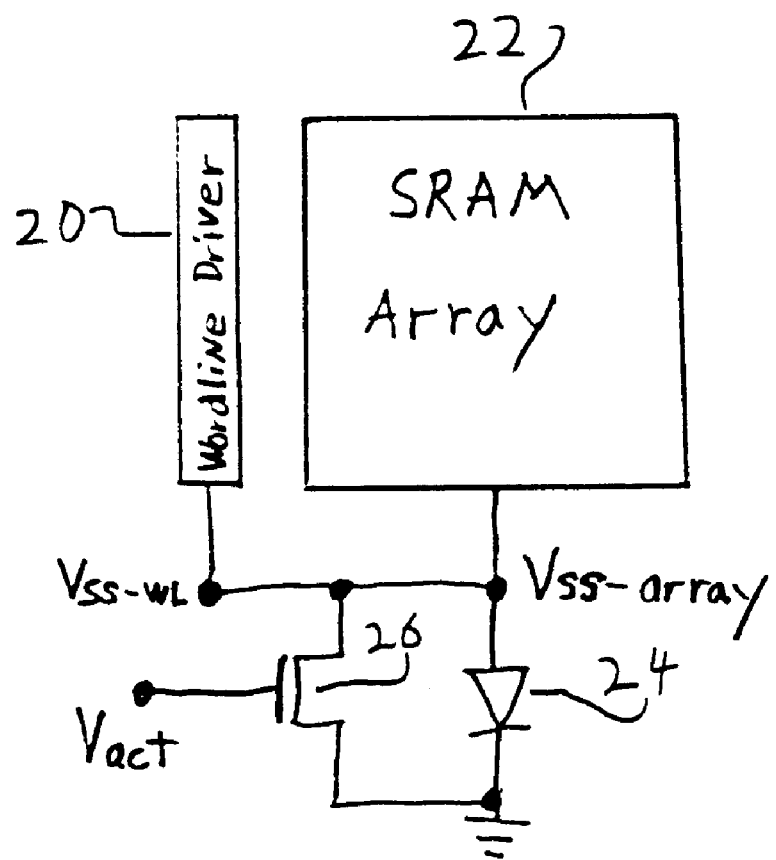
FIG. 1 is a diagram of a first embodiment SRAM array and wordline driver with supply voltage differential in standby.
Figure 2:
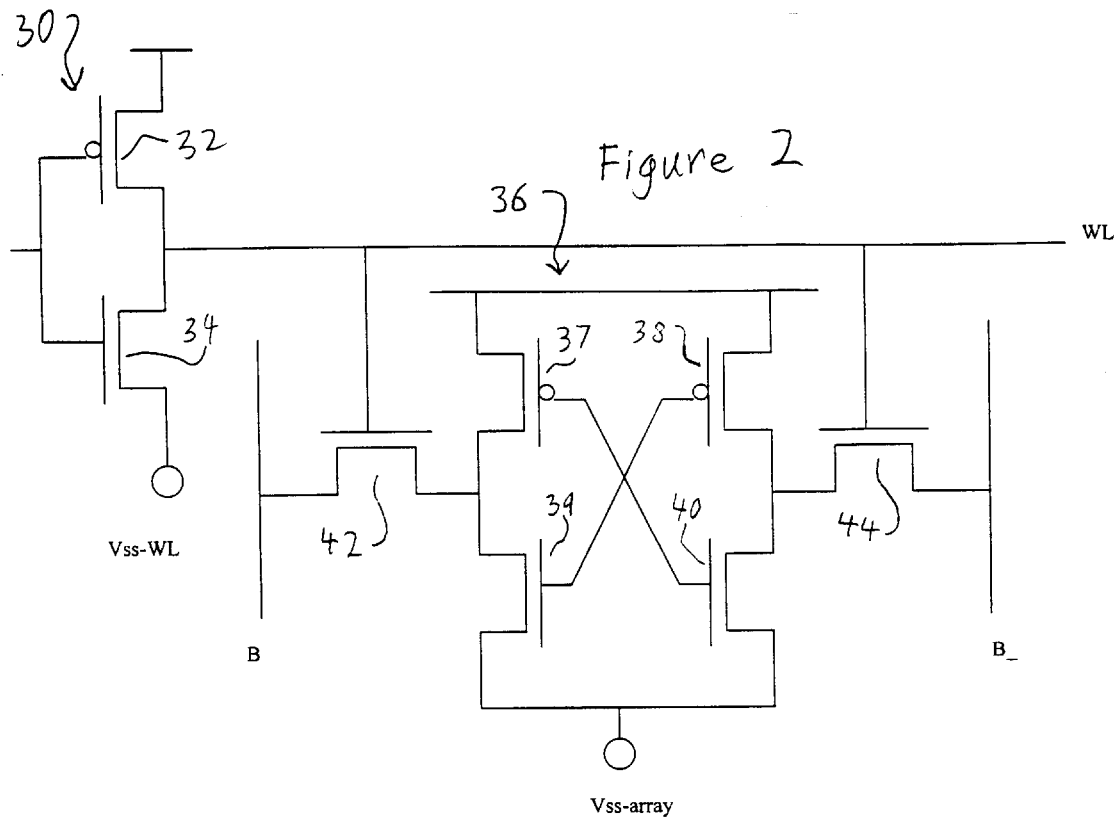
FIG. 2 is a detailed schematic circuit diagram of a portion of the wordline driver and a portion of the SRAM array of FIG.1.

Circuits in accordance with the present invention raise the wordline voltage when raising array voltage Vss-array in standby. The simplest implementation is the first embodiment of the present invention, shown in FIG. 1. The circuit of FIG. 1 includes a wordline driver 20; a memory array (SRAM) 22; a voltage offset device (diode) 24; switch (transistor) 26; and active signal Vact. The circuit of FIG. 2 shows a detailed circuit schematic of a portion of the wordline driver and a portion of the SRAM array. The circuit of FIG. 2 includes wordline drive portion 30 which includes, transistors 32 and 34; SRAM array portion 36 which includes transistors 31–40 and pass gates 42 and 44; wordline WL; and bit lines B and B_. The circuit of FIG. 1 ties the wordline driver low voltage supply (Vss-WL) to the array low voltage supply Vss-array, such that both are increased together, maintaining a zero gate-to-source voltage on the pass gates 42 and 44 in the array. Switch 26 is ON, when the array is in active mode and is OFF when the array is in standby mode. The voltage offset device 24 is a diode in the embodiment shown in FIG. 1, but the voltage offset can be provided by other devices such as transistors or voltage source devices such as low drop-out regulator devices. Optionally, the wordline driver low voltage supply Vss-WL can be isolated from the array low voltage supply Vss-array during active to avoid the large switching currents of the word line driver 20 from introducing noise in Vss-array during active. Devices 24 and 26 can be distributed devices in parallel.

Figure 3:
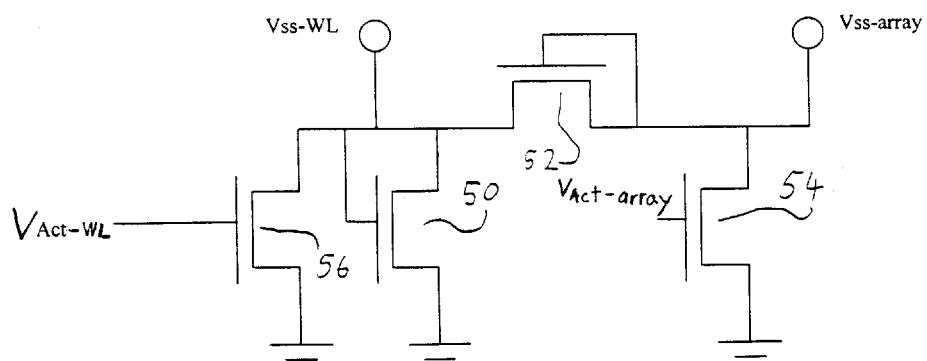
FIG. 3 is a diagram of a second embodiment SRAM array and wordline driver with supply voltage differential in standby.

In a second embodiment of the present invention, shown in FIG. 3, an off-set is provided between the wordline driver low voltage supply Vss-WL and array low voltage supply Vss-array such that a slightly negative gate-to-source voltage is applied to the pass gates 42 and 44 to reduce the subthreshold current component of the total leakage. The circuit of FIG. 3 includes voltage offset devices (transistors) 50 and 52; and switches (transistors) 54 and 56. Switches 54 and 56 pull the supply voltages Vss-WL and Vss-array to ground during active mode. The voltage offset devices 50 and 52, and switches 54 and 56 can be distributed devices in parallel.

In another embodiment of the present invention, voltage supplies Vss-array and Vss-WL are electrically isolated from each other in both active and standby. In a low power standby mode, voltage supply Vss-array is raised and voltage supply Vss-WL is raised to a voltage less than or equal to voltage supply Vss-array.

The timing sequence of raising and lowering supply voltages Vss-WL and Vss-array should be such that supply voltage Vss-WL does not rise above supply voltage Vss-array. They can be shifted simultaneously, or with a sequence such that array supply voltage Vss-array is raised before wordline supply voltage Vss-WL is raised, and supply voltage Vss-array is lowered after Vss-WL is lowered. For example, in FIG. 3, in a first configuration, control voltages Vact-array and Vact-WL can be the same, and switches 54 and 56 will be switched ON and OFF simultaneously. In a second configuration, voltages Vact-array and Vact-WL can be separate voltages such that switch 54 is switched OFF before switch 56 is switched OFF, and switch 56 is switched ON before switch 54 is switched ON.

The total leakage for n-channel transistors, consisting of subthreshold current, gate leakage, and GIDL generally will be minimized with a gate-to-source voltage that is slightly negative. A slightly negative gate-to-source voltage on the pass gate n-channel transistors 42 and 44 also reduces the probability that bit-line voltage will disturb a cell during standby.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, transistor polarities and source voltages could be reversed. The pass gate transistors 42 and 44 could be p-channel transistors instead of n-channel and the wordline voltage would be reversed. It is therefore intended that the appended claims encompass any such modifications or embodiments.

What is claimed is:

1. A circuit comprising:

a memory array having an array supply voltage node;

a wordline driver coupled to the memory array and having a wordline driver supply voltage node, wherein the wordline driver supply voltage node is coupled to the array supply voltage node;

a first offset voltage device coupled between the wordline driver supply voltage node and a first source voltage node;

a first bypass switch coupled between the wordline driver and a second source voltage node; and a second offset voltage device coupled between the array supply voltage node and the wordline driver supply voltage node.

2. The circuit of claim 1 wherein the first source voltage node is coupled to the second source voltage node.

3. The circuit of claim 1 wherein the first bypass switch is on when the memory array is in active mode.

4. The circuit of claim 1 wherein the first bypass switch is off when the memory array is in standby mode.

5. The circuit of claim 1 wherein the first bypass switch is on when the memory array is in active mode and off when the memory array is in standby mode.

6. The circuit of claim 1 wherein the memory array is an SRAM array.

7. The circuit of claim 1 wherein the first offset voltage device is a diode.

8. The circuit of claim 1 wherein the first offset voltage device is a transistor.

9. The circuit of claim 1 wherein the first bypass switch is a transistor.

10. The circuit of claim 1 further comprising a second bypass switch coupled between the array supply voltage node and the second source voltage node.

11. The circuit of claim 10 wherein the first bypass switch has a control node coupled to a first control signal, and the second bypass switch has a control node coupled to a second control signal.

12. The circuit of claim 1 wherein the second offset voltage device is a transistor.

* * * * *